(12) United States Patent
Bogen et al.

(10) Patent No.: US 12,094,797 B2
(45) Date of Patent: Sep. 17, 2024

(54) PRESSING DEVICE FOR DIRECTLY OR INDIRECTLY APPLYING PRESSURE TO POWER-SEMICONDUCTOR COMPONENTS OF A POWER-SEMICONDUCTOR MODULE

(71) Applicant: SEMIKRON ELEKTRONIK GMBH & CO. KG, Nuremberg (DE)

(72) Inventors: Ingo Bogen, Nuremberg (DE); Manuel Noderer, Nuremberg (DE); Alexander Wehner, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 319 days.

(21) Appl. No.: 17/840,405

(22) Filed: Jun. 14, 2022

(65) Prior Publication Data

US 2022/0406674 A1     Dec. 22, 2022

(30) Foreign Application Priority Data

Jun. 21, 2021 (DE) ...................... 10 2021 115 926.1

(51) Int. Cl.
H01L 23/32     (2006.01)
(52) U.S. Cl.
CPC .................................. H01L 23/32 (2013.01)
(58) Field of Classification Search
CPC ....................................................... H01L 23/32
USPC ....................................................... 257/723
See application file for complete search history.

(56) References Cited

U.S. PATENT DOCUMENTS

2023/0180400 A1 *  6/2023  Herbrandt .................. F16B 2/22
                                                                    174/535

FOREIGN PATENT DOCUMENTS

| DE | 102013104950 B3 * | 4/2013 | ........... H01L 23/433 |
| DE | 102017107117 B3 | 5/2018 | |
| DE | 102016123697 A1 | 6/2018 | |

OTHER PUBLICATIONS

DE 10 2021 115926.1, German Search Report dated Jan. 21, 2022, 6 pages—German, 6 pages—English.

* cited by examiner

Primary Examiner — Ajay Arora
(74) Attorney, Agent, or Firm — Andrew F. Young; NOLTE LACKENBACH SIEGEL (57) ABSTRACT

A pressing device for indirectly or directly applying pressure to power-semiconductor components of a power-semiconductor module, having a pressing plate, having a pressing nub element which is formed from an elastic material and which has a pressing nub plate and pressing nubs projecting therefrom, and having a receiving device for receiving the pressing nub element, which receiving device has a base plate provided with recesses, wherein the recesses run through the base plate, wherein the pressing nub plate is arranged on the base plate and the pressing nubs run through the recesses and, on the main side of the base plate facing away from the pressing nub plate, project beyond this main side of the base plate, and wherein the pressing nub plate is arranged between the pressing plate and the base plate.

18 Claims, 8 Drawing Sheets

PRESSING DEVICE FOR DIRECTLY OR INDIRECTLY APPLYING PRESSURE TO POWER-SEMICONDUCTOR COMPONENTS OF A POWER-SEMICONDUCTOR MODULE

CROSS REFERENCE TO RELATED APPLICATIONS

This application relates to and claims priority to DE 10 2021 115 926.1 filed Jun. 21, 2021, the entire contents of which are incorporated herein fully by reference.

FIGURE SELECTED FOR PUBLICATION

FIG. 1.

BACKGROUND OF THE INVENTION

Field of the Invention

The invention relates to a pressing device for indirectly or directly applying pressure to power-semiconductor components of a power-semiconductor module.

Description of the Related Art

DE 10 2016 123 697 A1 describes a pressing device for applying pressure to power-semiconductor components of a power-semiconductor module, comprising a pressing plate and a pressing nub element formed from an elastic material and having a pressing nub plate and pressing nubs projecting therefrom. The disadvantage here is that the pressing nubs, since they are formed from an elastic material, can deform in the lateral direction when pressure is applied, and thus the amount of pressure that can be transmitted from the pressing plate via the pressing nubs is very limited.

Furthermore, such a pressing device must be able to be produced efficiently.

ASPECTS AND OBJECTS OF THE INVENTION

It is the object of the invention to provide pressing device, that can be produced efficiently, for directly or indirectly applying pressure to power-semiconductor components of a power-semiconductor module, which enables a high pressure to be applied to the power-semiconductor components.

This object is achieved by a pressing device for indirectly or directly applying pressure to power-semiconductor components of a power-semiconductor module, the pressing device having a pressing plate, having a pressing nub element which is formed from an elastic material and has a pressing nub plate and pressing nubs projecting therefrom, and having a receiving device for receiving the pressing nub element, the receiving device having a base plate provided with recesses, wherein the recesses run through the base plate, wherein the pressing nub plate is arranged on the base plate and the pressing nubs run through the recesses and, on the main side of the base plate facing away from the pressing nub plate, project beyond this main side of the base plate, wherein the pressing nub plate is arranged between the pressing plate and the base plate.

It has proven to be advantageous if the receiving device has an edge element arranged on a lateral edge region of the base plate, running around a center of the base plate at least in some portions, and projecting from the base plate in the direction of the pressing plate, wherein the edge element laterally runs around the pressing nub plate. The edge element limits the possibility for lateral movement of the pressing nub plate.

In this context, it has proven to be advantageous if a gap is formed between the pressing plate and the edge element and an edge region element of the pressing nub element projecting from the pressing nub plate is arranged in the gap, wherein the edge region element presses against the pressing plate in a direction perpendicular to the normal direction of the pressing plate. This connects the pressing plate to the pressing nub element in a frictionally engaged manner.

Furthermore, it has proven to be advantageous if the receiving device has a hook element which limits a movement of the pressing plate in the normal direction of the pressing plate, in the direction away from the base plate, by way of an interlocking fit with the pressing plate. In this way, the pressing plate, the pressing nub plate and the receiving device together form a structural unit. The pressing device is thus in the form of a structural unit.

Furthermore, it has proven to be advantageous if the receiving device has a pressing element, wherein in the edge region of the pressing nub plate the pressing nub element has a tab projecting from the pressing nub plate in the direction away from the base plate, wherein at least a part of the tab is arranged between the pressing element and the pressing plate. The pressing plate, the pressing nub plate and the receiving device hereby together form a structural unit. The pressing device is thus in the form of a structural unit.

In this context, it has proven to be advantageous if a portion of the tab has a mechanical contact with a main side of the pressing plate facing away from the base plate. This reliably limits a movement of the pressing nub element in the direction away from the base plate.

Further, it has proven to be advantageous if the pressing plate has a pressing plate opening therethrough, the pressing nub plate has a pressing nub plate opening therethrough, and the base plate has a base plate opening therethrough, wherein the pressing plate opening, the pressing nub plate opening, and the base plate opening are arranged in alignment with each other in the normal direction of the pressing plate. The pressing device can thus be easily mounted in a power-semiconductor module.

In this context, it has proven to be advantageous if the receiving device has a base plate opening element, which runs around the base plate opening, projects from the base plate in the direction of the pressing plate opening, and in particular is annular, wherein a part of the base plate opening element is arranged in the pressing plate opening. An exact positioning of the pressing plate in relation to the receiving device is hereby achieved.

In this context, it has proven to be advantageous if an inner wall surface of the base plate opening element delimiting the base plate opening is formed in such a way that the base plate opening decreases in size in the direction of the pressing plate. This enables a simple, mechanically very stable, positionally accurate assembly of the pressing device in a power-semiconductor module. This prevents the pressing device from vibrating independently of the other elements of the power-semiconductor module in the event of a mechanical vibration load acting on the power-semiconductor module.

Furthermore, it has proven to be advantageous if the pressing nub element has a pressing nub plate opening element, which runs around the pressing nub plate opening, projects from the pressing nub plate, and in particular is annular, wherein a part of the pressing nub plate opening element is arranged in the pressing plate opening and/or in the base plate opening. This achieves an exact positioning of the pressing nub element in relation to the pressing plate and/or the receiving device.

In this context, it has proven to be advantageous if an inner wall surface of the pressing nub plate opening element delimiting the pressing nub plate opening is formed in such a way that the pressing nub plate opening decreases in size in the direction of the pressing plate. This enables a simple, mechanically very stable, positionally accurate assembly of the pressing device in a power-semiconductor module. This prevents the pressing device from vibrating independently of the other elements of the power-semiconductor module in the event of a mechanical vibration load acting on the power-semiconductor module.

Furthermore, a power-semiconductor module having a pressing device according to the invention and having a substrate on which power-semiconductor components are arranged and are electrically conductively contacted with the substrate, wherein at least some of the pressing nubs are arranged in alignment with the power-semiconductor components above the power-semiconductor components, so that the power-semiconductor components are arranged between the relevant pressing nubs and the substrate, wherein the relevant pressing nubs are designed to exert a pressure, acting in the direction of the substrate, directly or indirectly on the power-semiconductor components, has proven to be advantageous.

In this context, it has proven to be advantageous if the power-semiconductor module has a frame element with a sleeve running in the direction of the pressing device, wherein a part of the sleeve is arranged in the base plate opening. This achieves an exact positioning of the pressing device, in particular the receiving device, in relation to the frame element.

In this context, it has proven to be advantageous if a part of the sleeve is arranged in the pressing nub plate opening. This achieves an exact positioning of the pressing device, in particular the pressing nub element, in relation to the frame element.

Furthermore, it has proven to be advantageous if the diameter of a portion of an outer wall of the sleeve that is in mechanical contact with the pressing device decreases in size in the direction away from the substrate. This enables a simple, mechanically very stable, positionally accurate mounting of the pressing device in a power-semiconductor module. This prevents the pressing device from vibrating independently of the other elements of the power-semiconductor module in the event of a mechanical vibration load acting on the power-semiconductor module.

Furthermore, it has proven to be advantageous if the power-semiconductor module has a pressure-generating device, wherein the pressure-generating device is designed to press the pressing device in the direction of the substrate. In this way, the power-semiconductor module has its own pressure-generating device.

In this context, it has proven to be advantageous if the pressing plate has a pressing plate opening therethrough, the pressing nub plate has a pressing nub plate opening therethrough, and the base plate has a base plate opening therethrough, wherein the pressing plate opening, the pressing nub plate opening, and the base plate opening are arranged in alignment with each other in the normal direction (N) of the pressing plate, when the pressure-generating device has a screw passing through the pressing plate opening, through the pressing nub plate opening, through the base plate opening, and through an opening of the substrate, and has a spring element, wherein the screw is designed to press the pressing device in the direction of the substrate via the spring element. The pressure-generating device is hereby of a particularly simple and reliable design.

Furthermore, a power-electronic arrangement comprising such a power-semiconductor module and comprising a base plate on which the substrate is arranged, wherein the base plate is part of a heat sink or is provided for arrangement on a heat sink, has proven to be advantageous.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 1:
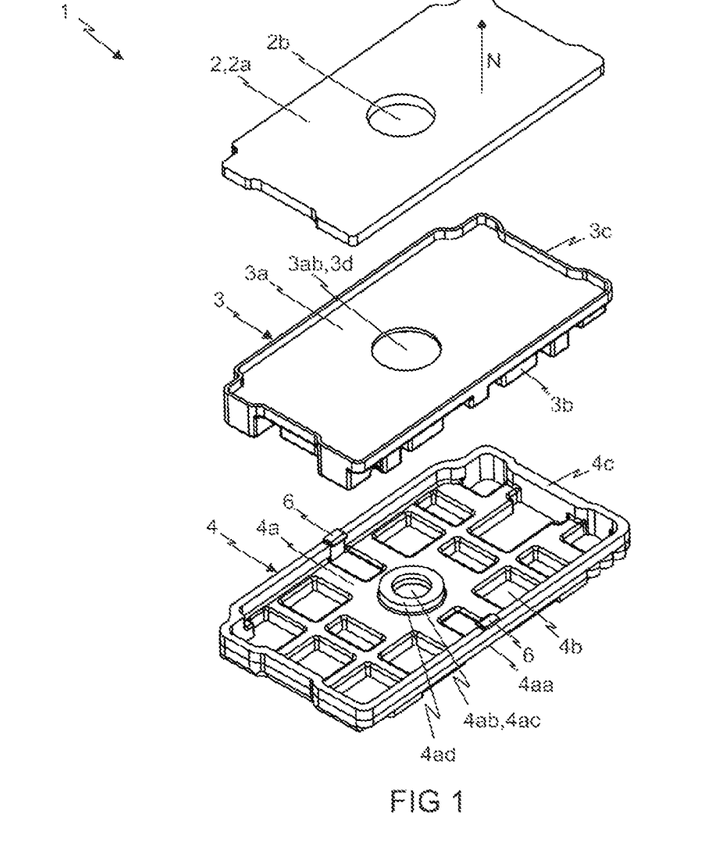
FIG. 1 Shows an exploded view of a first design of a pressing device according to the invention.
Figure 2:
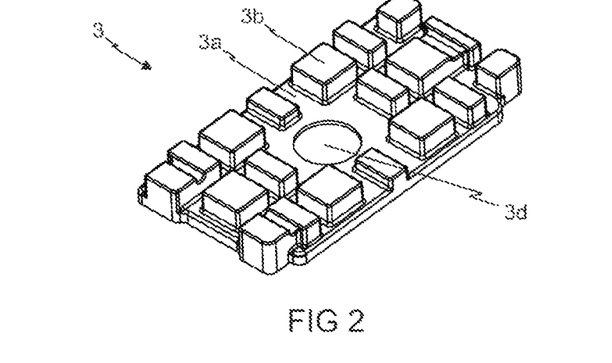
FIG. 2 Shows a pressing nub element of the first design of a pressing device according to the invention, wherein the pressing nub element is shown rotated through 180° with respect to FIG. 1.
Figure 3:
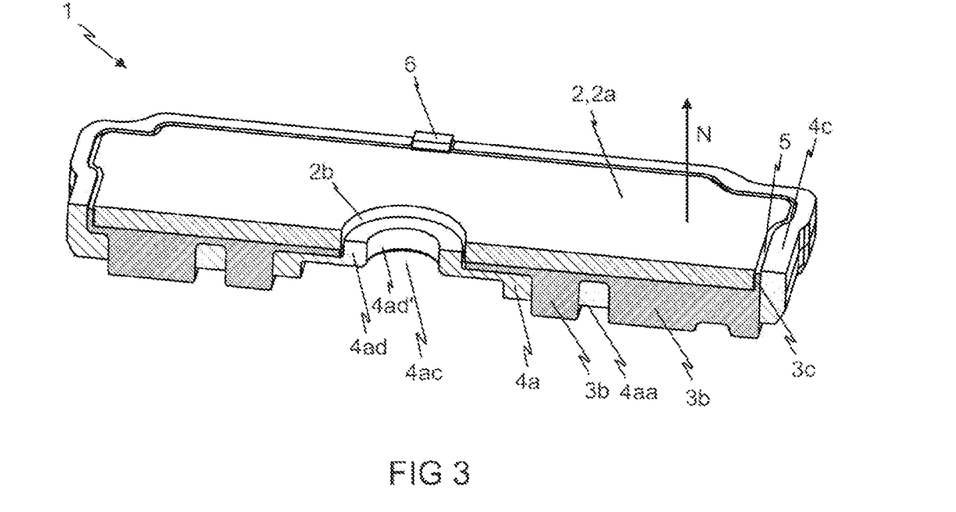
FIG. 3 Shows a perspective sectional view of the first design of a pressing device according to the invention.
Figure 4:
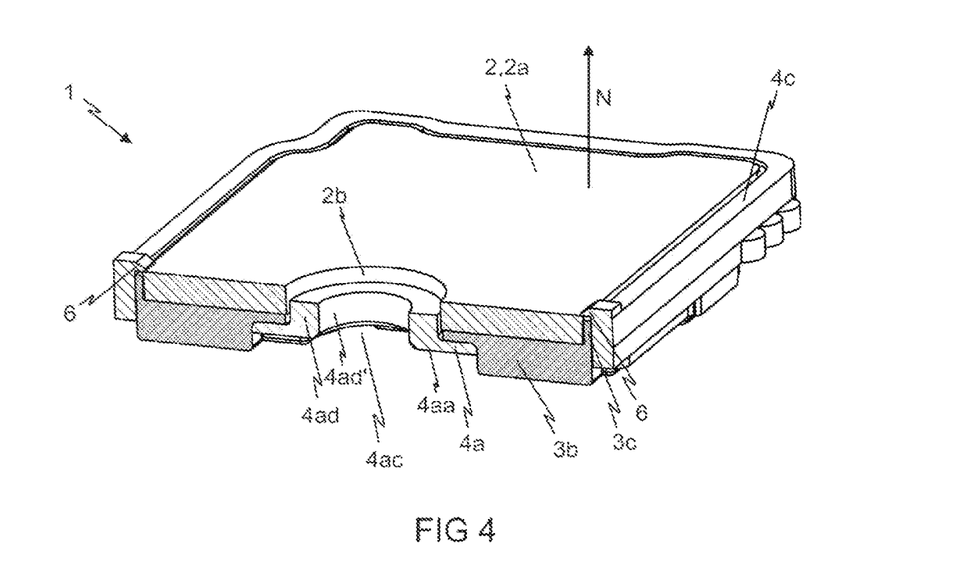
FIG. 4 Shows a perspective further sectional view of the first design of a pressing device according to the invention.

FIG. 1 shows an exploded view of a first design of a pressing device 1 according to the invention. In FIG. 2, a pressing nub element 3 of the pressing device 1 is shown, wherein the pressing nub element 1 is shown rotated through 180° with respect to FIG. 1. In FIG. 3 and FIG. 4, perspective sectional views of the pressing device 1 are shown.

It should be noted that the advantageous elements or advantageous designs and design variants mentioned in one of the exemplary embodiments can also be realized in another of the described exemplary embodiments, insofar as this is possible. Furthermore, mixed forms between the exemplary embodiments can also be realized in the invention. In order to avoid repetitions in the description, advantageous elements or advantageous designs and design variants are described sometimes for only one of the exemplary embodiments.

The pressing device 1 according to the invention has a pressing plate preferably formed from a metal and a pressing nub element 3 formed from an elastic material, such as an elastomer, in particular a cross-linked silicone rubber, which has a pressing nub plate 3a and pressing nubs 3b projecting therefrom. The pressing nub element 3 is formed in one piece in all exemplary embodiments.

The pressing device 1 further comprises a receiving device 4 for receiving the pressing nub element 3, which comprises a base plate 4a provided with recesses 4b, wherein the recesses 4b run through the base plate 4a.

The pressing nub plate 3a is arranged on the base plate 4a. The pressing nubs 3b run through the recesses 4b and project on the main side 4aa of the base plate 4a facing away from the pressing nub plate 3a, beyond this main side 4aa of the base plate 4a, wherein the pressing nub plate 3a is arranged between the pressing plate 2 and the base plate 4a. In all exemplary embodiments, the pressing nub element 3 is not connected in a materially-bonded manner to the pressing plate 2 or to the receiving device 4. However, in all exemplary embodiments, the pressing nub element 3 can also be connected in a materially-bonded manner to the pressing plate 2 and/or to the receiving device 4, for example by means of an adhesive connection. In the sense of the invention, the pressing nub element 3 can be connected in a materially-bonded manner to the pressing plate 2 and/or to the receiving device 4 by injection-moulding the pressing nub element 3 to the pressing plate 2 and/or to the receiving device 4.

Due to the fact that the pressing nubs 3b run through the recesses 4b, the pressing nubs 3b are mechanically guided or stabilized in the normal direction N of the pressing plate 3 by the receiving device 4, so that the pressing nubs 3b can transmit a high pressing force in the normal direction N of the pressing plate 3. The pressing device 1 can be efficiently produced, since, for its production, only the pressing nub element 3 has to be placed on the base plate 4a in such a way that the pressing nubs 3b run through the recesses 4b. Here, the pressing plate 2 can be arranged on the pressing nub plate 3a beforehand or afterwards.

The receiving device 4 preferably has an edge element 4c arranged at a lateral edge region of the base plate 4a, running around a center 4ab of the base plate 4a at least in some portions, preferably in a closed manner, and projecting from the base plate 4a in the direction of the pressing plate 2. The edge element 4c laterally runs around the pressing nub plate 3a. A gap 5 is preferably formed between the pressing plate 2 and the edge element 4c. An edge region element 3c of the pressing nub element 3 projecting from the pressing nub plate 3a is arranged in the gap 5, wherein the edge region element 3c presses against the pressing plate 2 in a direction perpendicular to the normal direction N of the pressing plate 2. The edge region element 3c of the pressing nub element 3, at a lateral edge region of the pressing nub plate 3a, runs at least in some portions, preferably in a closed manner, around a center 3ab of the pressing nub plate 3a. The pressing plate 2, as described in the previous paragraph, can be arranged beforehand on the pressing nub plate 3a and can be connected in a frictionally engaged manner to the pressing nub element 3 by means of the edge region element 3c, so that the pressing plate 2 and the pressing nub plate 3a together form a structural unit. The edge region element 3c presses here against the pressing plate 2 in a direction perpendicular to the normal direction N of the pressing plate 2, in the direction of the centre 3ab of the pressing nub plate 3a.

The receiving device 4 preferably has a hook element 6 which, in the normal direction N of the pressing plate 2, in the direction away from the base plate 4a, limits a movement of the pressing plate 2 by way of an interlocking fit with the pressing plate 2. In this way, the pressing plate 2, the pressing nub plate 3a and the receiving device 4 together form a structural unit. The pressing device 1 is thus in the form of a structural unit.

The pressing plate 2 preferably has a pressing plate opening 2b passing therethrough, the pressing nub plate 3a has a pressing nub plate opening 3d passing therethrough, and the base plate 4a has a base plate opening 4ac passing therethrough. The pressing plate opening 2b, the pressing nub plate opening 3d and the base plate opening 4ac are arranged in alignment with each other in the normal direction N of the pressing plate 2. The openings 2b, 3d and 4ac enable a simple and highly reliable formation of a pressure-generating device 17 of a power-semiconductor module 10 (see FIG. 13 and FIG. 14).

The receiving device 4 preferably has a base plate opening element 4ad, which runs around the base plate opening 4ac, projects from the base plate 4a in the direction of the pressing plate opening 2b, and in particular is annular, wherein a part of the base plate opening element 4ad is arranged in the pressing plate opening 2b. An inner wall surface 4ad' of the base plate opening element 4ad delimiting the base plate opening 4ac can be designed in such a way that the base plate opening 4ac decreases in size in the direction of the pressing plate 2, which is not shown in the figures.

Figure 5:
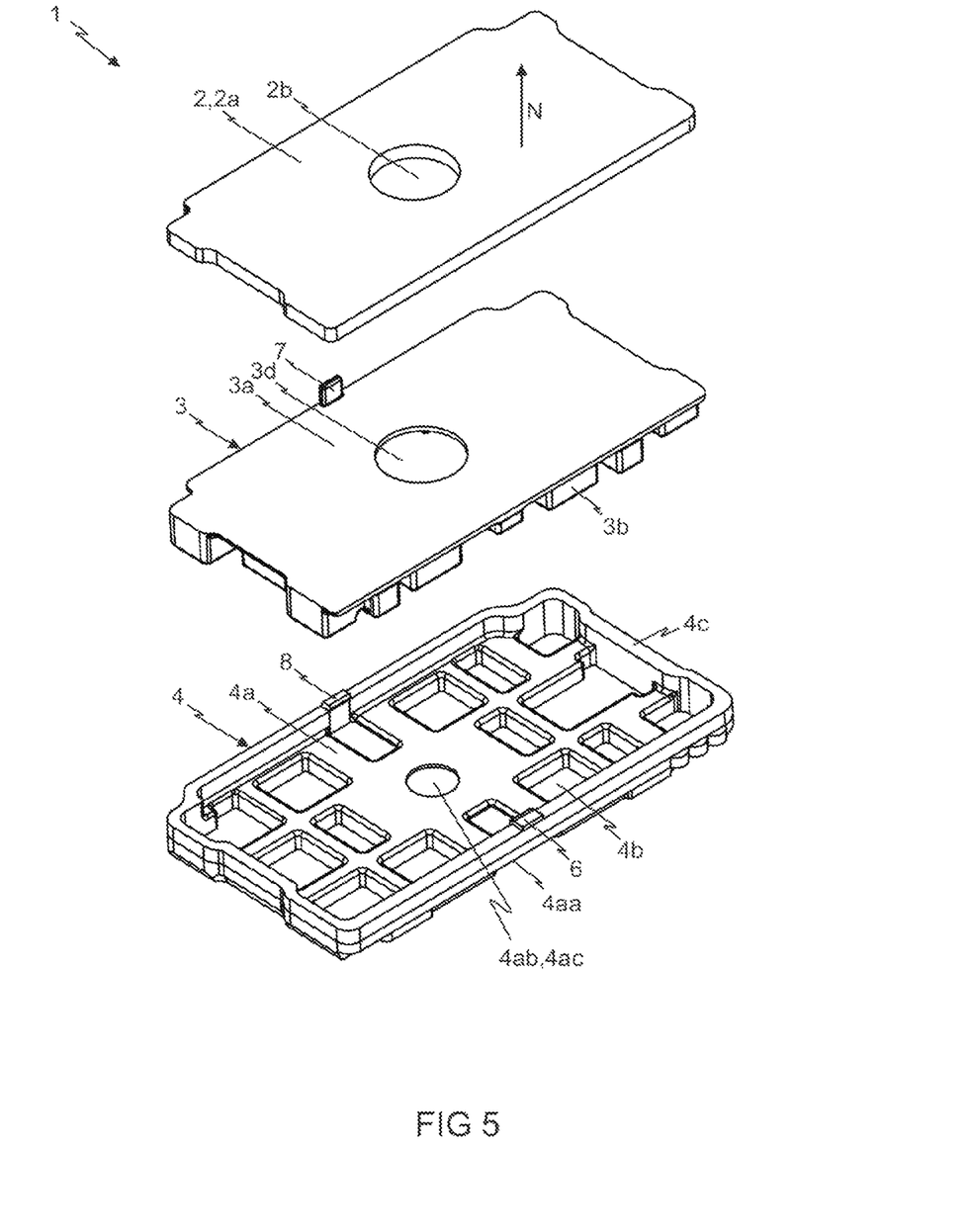
FIG. 5 Shows an exploded view of a second design of a pressing device according to the invention.
Figure 6:
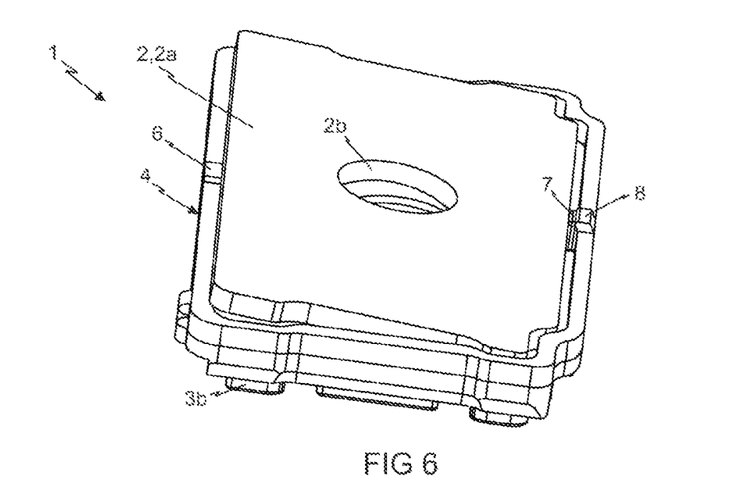
FIG. 6 Shows a perspective view of the second design of a pressing device according to the invention in a not yet finished state.
Figure 7:
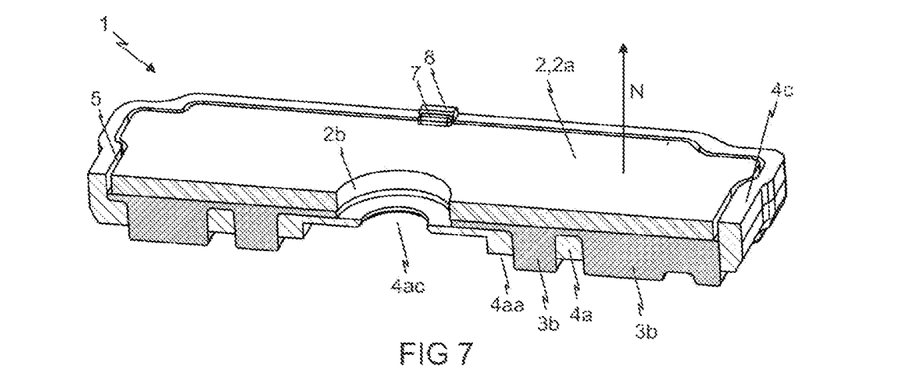
FIG. 7 Shows a perspective sectional view of the second design of a pressing device according to the invention.
Figure 8:
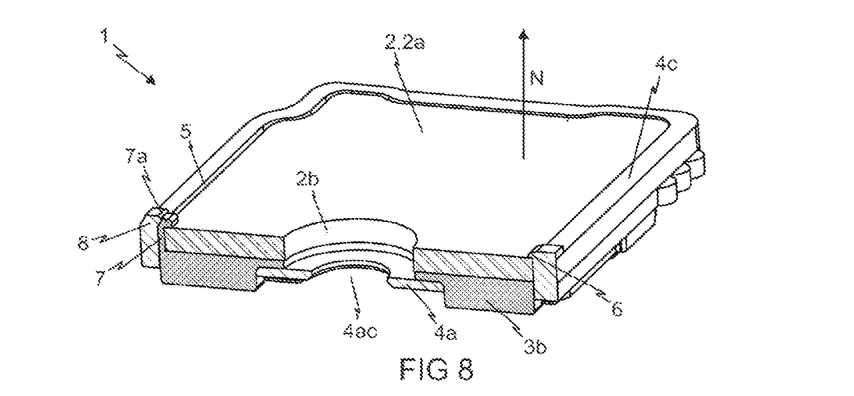
FIG. 8 Shows a perspective further sectional view of the second design of a pressing device according to the invention.

FIG. 5 shows an exploded view of a second design of a pressing device 1 according to the invention. FIG. 6 shows a perspective view of the second design of a pressing device 1 according to the invention in a not yet finished state. In FIG. 7 and FIG. 8, perspective sectional views of the second design of the pressing device 1 are shown. The second design of the pressing device 1, including advantageous designs and design variants, corresponds substantially to the first design of the pressing device 1.

In the second design of the pressing device 1, the receiving device 4 has a pressing element 8. Furthermore, in the second design of the pressing device 1, the pressing nub element 3 has a tab 7 in the edge region of the pressing nub plate 3a, the tab projecting from the pressing nub plate 3a in the direction away from the base plate 4a. At least part of the tab 7 is arranged between the pressing element 8 and the pressing plate 2.

As shown in FIG. 6, the pressing plate 2 can be connected in a frictionally engaged manner to the receiving device 4 by means of the pressing element 8 and the tab 7, so that the pressing plate 2, the pressing nub plate 3a and the receiving device together form a structural unit. The tab 7 is pressed together here by the pressing plate 2 and the pressing element 8, and as a result presses against the pressing plate 2 in a direction perpendicular to the normal direction N of the pressing plate 2. A portion 7a of the tab 7 preferably has a mechanical contact with a main side 2a of the pressing plate 2 facing away from the base plate 4a. This limits, in the region of the pressing element 8, a movement of the pressing plate 2 in the normal direction N of the pressing plate 2 in the direction away from the pressing nub element 3. It should be noted that, in the second design of the pressing device 1, the edge region element 3c, as well as the base plate opening element 4ad, can additionally be present as in the second design of the pressing device 1 (not shown in FIGS. 5 to 8).

Figure 9:
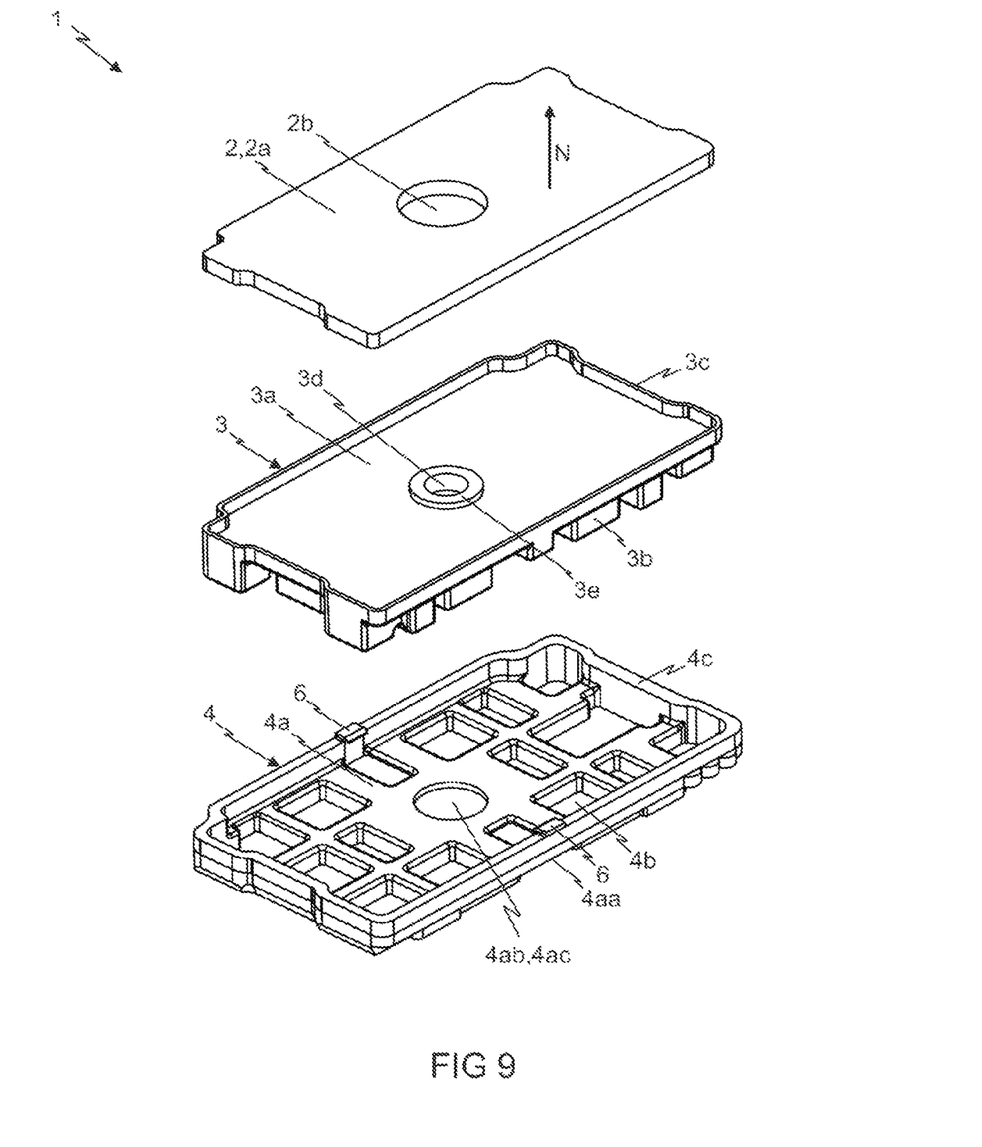
FIG. 9 Shows an exploded view of a third design of a pressing device according to the invention.
Figure 10:
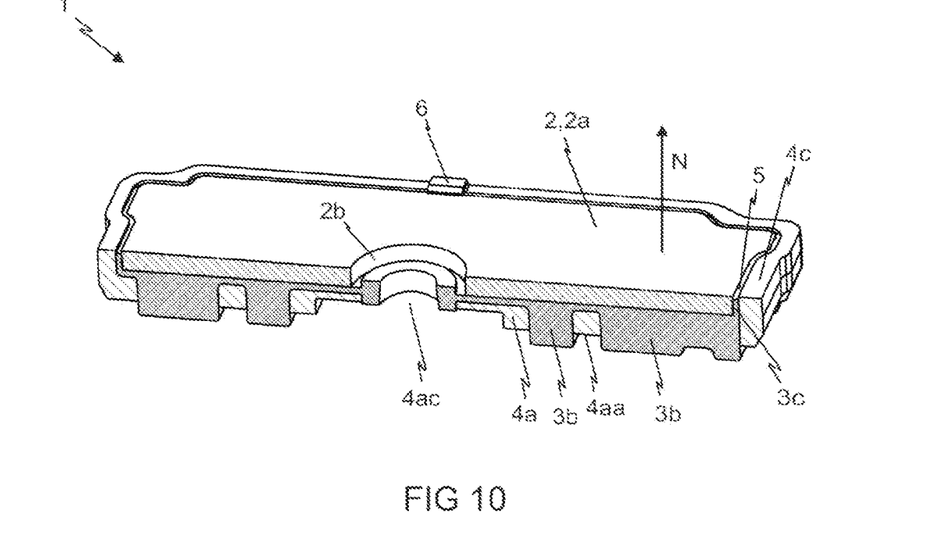
FIG. 10 Shows a perspective sectional view of the third design of a pressing device according to the invention.
Figure 11:
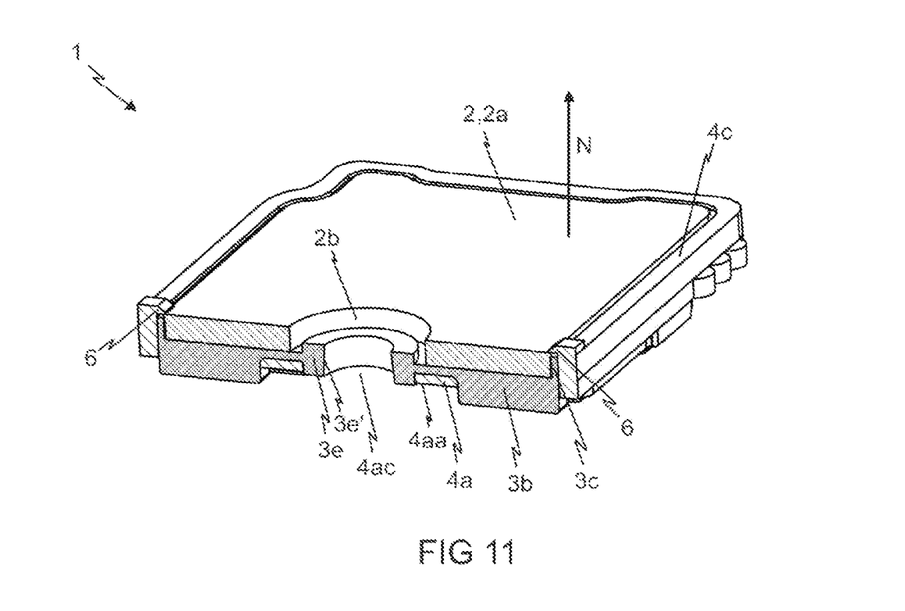
FIG. 11 Shows a perspective further sectional view of the third design of a pressing device according to the invention.

FIG. 9 shows an exploded view of a third design of a pressing device 1 according to the invention. In FIG. 10 and FIG. 11, perspective sectional views of the third design of the pressing device 1 are shown. The third design of the pressing device 1, including advantageous designs and design variants, is substantially the same as the first embodiment of the pressing device 1. It should be noted that the third design of the pressing device 1, including advantageous designs and design variants, can also correspond substantially to the second design of the pressing device 1.

In the third design of the pressing device 1, the pressing nub element 3 has a pressing nub plate opening element 3e, which runs around the pressing nub plate opening 3d, projects from the pressing nub plate 3a, and in particular is annular. A part of the nub plate opening element 3e is arranged in the pressing plate opening 2b and/or in the base plate opening 4ac. An inner wall surface 3e' of the pressing nub plate opening element 3e delimiting the pressing nub plate opening 3d is preferably formed in such a way that the pressing nub plate opening 3d decreases in size in the direction of the pressing plate 2. Compared to the first design of the pressing device 1, the base plate opening element 4ad, which is preferably present in the first design of the pressing device 1, is omitted in the third design of the pressing device 1.

Figure 12:
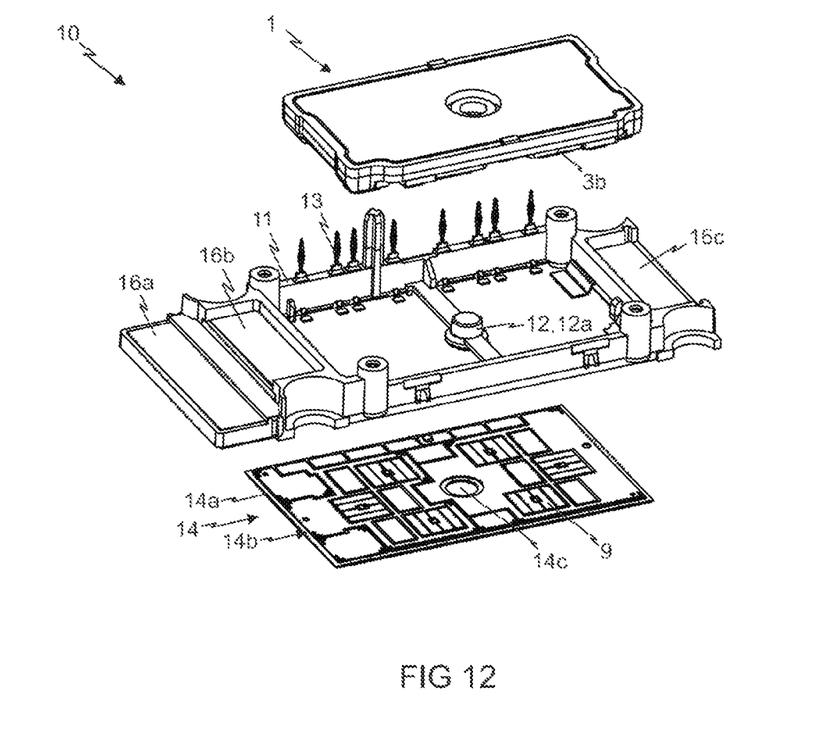
FIG. 12 Shows an exploded view of a power-semiconductor module with a pressing device according to the invention, wherein a pressure-generating device of the power-semiconductor module is not shown.
Figure 13:
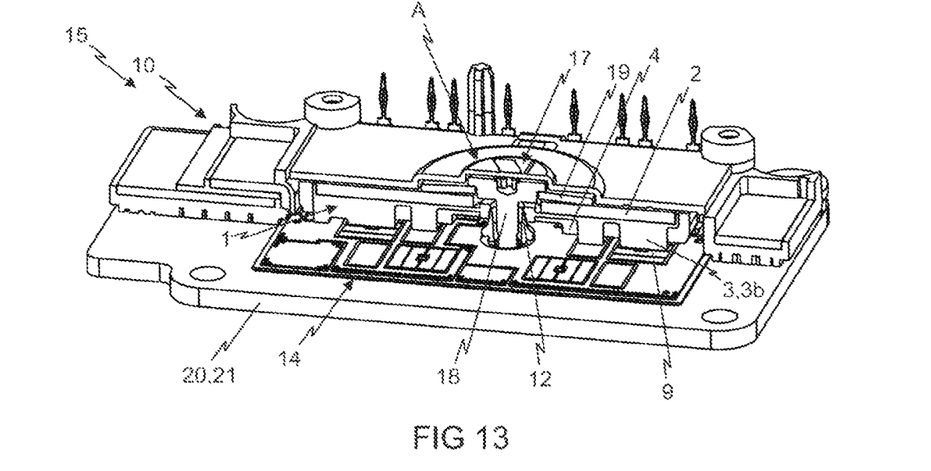
FIG. 13 Shows a perspective sectional view of a power-electronic arrangement.

In FIG. 12, an exploded view of a power-semiconductor module 10 with a pressing device 1 according to the invention is shown, wherein a pressure-generating device 17 of the power-semiconductor module 10 is not shown. In FIG. 13 a perspective sectional view of a power-electronic arrangement 15 is shown, and in FIG. 14 a sectional view of a region A of FIG. 13 is shown.

Figure 14:
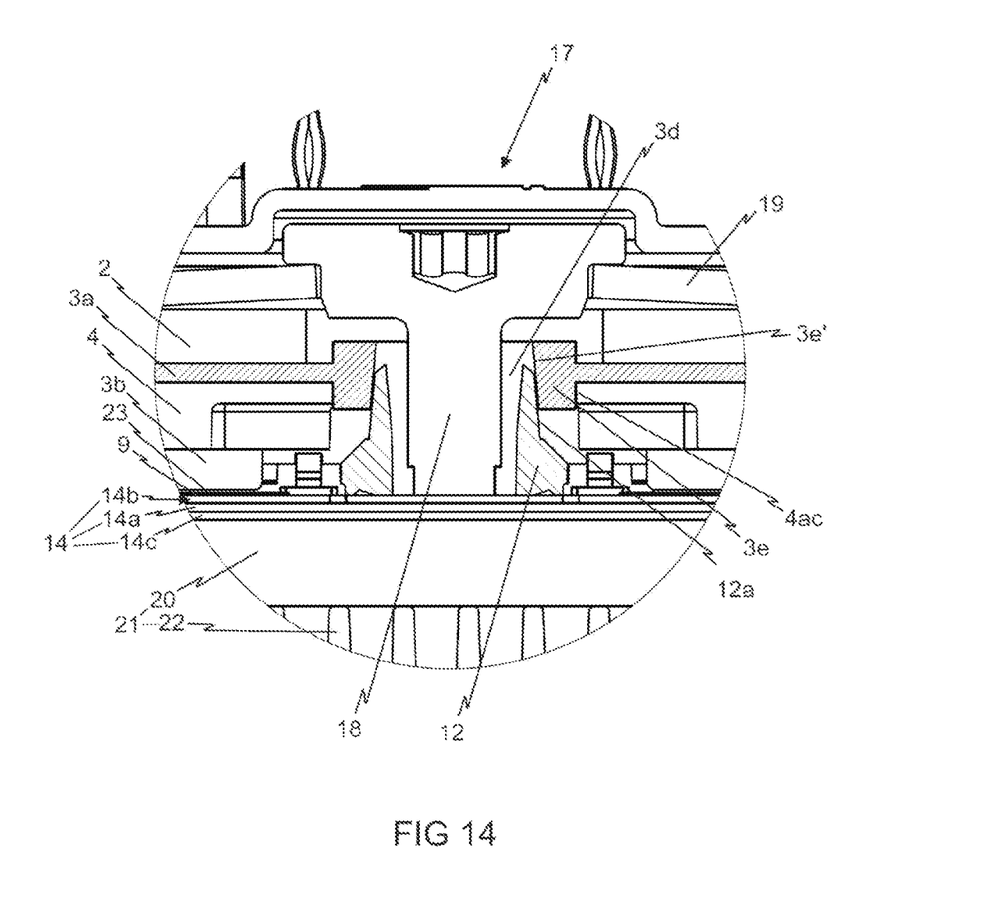
FIG. 14 Shows a sectional view of a region A of FIG. 13.

The power-semiconductor module 10 has a pressing device 1 according to the invention and a substrate 14, on which power-semiconductor components 9 are arranged and electrically conductively contacted with the substrate 14. The substrate 14 has an electrically non-conductive insulation layer 14a and a metal layer 14b, which is arranged on the insulation layer 14a and is structured to form conductor tracks. Preferably, the substrate 5 has an electrically conductive, preferably unstructured further metal layer 14c, wherein the insulation layer 14a is arranged between the metal layer 14b and the further metal layer 14cc. The insulation layer 14a can be formed, for example, as a ceramic plate. The substrate 14 can be formed, for example, as a direct copper bonded substrate (DCB substrate), as an active metal brazing substrate (AMB substrate) or as an insulated metal substrate (IMS).

The power-semiconductor components 9 are preferably electrically conductively contacted with the metal layer 14b by means of a soldered or sintered connection. Each power-semiconductor component 9 is preferably in the form of a power-semiconductor switch or a diode. The power-semiconductor switches 9 are generally in the form here of transistors, such as IGBTs (insulated Gate Bipolar Transistor) or MOSFETs (Metal Oxide Semiconductor Field Effect Transistor), or in the form of thyristors.

It should be noted that the power-semiconductor components 9 are electrically conductively connected to one another on their side facing away from the substrate 14, by means of, for example, bonding wires and/or an electrically conductive foil composite, and to the conductor tracks of the substrate 14, in accordance with the desired electrical circuit, for example a half-bridge circuit, which the power-semiconductor module 10 is intended to realize. For clarity, the bonding wires or the foil composite are not shown in FIG. 1 and FIG. 6.

At least some of the pressing nubs 3b are arranged in alignment with the power-semiconductor components 9 above the power-semiconductor components 9, so that the power-semiconductor components 9 are arranged between the relevant pressing nubs 3b and the substrate 14. The relevant pressing nubs 3b are designed to directly or indirectly exert a pressure, acting in the direction of the substrate 14, on the power-semiconductor components 9. In the exemplary embodiments, an electrically conductive foil composite, not shown in the figures for the sake of clarity, is arranged between the power-semiconductor components 9 and the relevant pressing nubs 3b, so that the relevant pressing nubs 3b in the exemplary embodiments are designed to exert a pressure, acting in the direction of the substrate 14, on the power-semiconductor components 9 indirectly, i.e., here via the foil composite.

The power-semiconductor module 10 preferably comprises a frame element 11 having a sleeve 12 running in the direction of the pressing device 1, wherein a part of the sleeve 12 is arranged in the base plate opening 4ac. The frame element 11 preferably forms a housing part of the power-semiconductor module 10. A part of the sleeve 12 is disposed in the pressing nub plate opening 3d. The diameter of a portion of an outer wall 12a of the sleeve 12 having a mechanical contact with the pressing device 1 preferably decreases in size in a direction away from the substrate 14.

The power-semiconductor module 10 preferably comprises a pressure-generating device 17, as shown by way of example in FIG. 13 and FIG. 14. The pressure-generating device 17 is designed to press the pressing device 1 in the direction of the substrate 14. The pressure-generating device 17 preferably comprises a screw 18 passing through the pressing plate opening 2b, through the pressing nub plate opening 3d, through the base plate opening 4ac and through an opening 14c of the substrate 14, and a spring element 19. The screw 18 is designed to press the pressing device 1 in the direction of the substrate 14 via the spring element 19, which is preferably designed as a disc spring.

The power-semiconductor module 10 further comprises first and a second DC voltage load potential terminal 16a and 16b, an AC voltage load terminal 16c, and control terminals 13 for electrically connecting the power-semiconductor module 10 to external elements within the scope of the exemplary embodiments.

The power-electronic arrangement 15 comprises the power-semiconductor module 10 and a base plate 20, on which the substrate 14 is arranged. The base plate 20, as in the exemplary embodiment, can be part of a heat sink 21 or can be provided for arrangement on a heat sink. The heat sink 21 preferably has cooling fins or cooling nubs 22. The base plate 20 preferably has a blind hole, wherein an inner wall of the base plate 20 surrounds the blind hole being provided with an internal thread, into which the screw 18 is screwed. As a result, the screw 18 presses the spring element 19 in the direction of the substrate 14 against the pressing device 1, so that the pressing nubs 3b press indirectly or directly against the power-semiconductor components 9 and the substrate 14 is thereby pressed against the base plate 20, whereby the substrate 14 is thermally conductively coupled to the base plate 20.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they conic within the scope of the appended claims and their equivalents.

What is claimed is:

1. A pressing device, for indirectly or directly applying pressure to power-semiconductor components of a power-semiconductor module, the pressing device comprising:
a pressing plate having a pressing nub element formed from an elastic material and which has a pressing nub plate and pressing nubs projecting therefrom;
a receiving device for receiving the pressing nub element and having a base plate provided with a plurality of recesses;
wherein the recesses run through the base plate;
wherein the pressing nub plate is arranged on the base plate and the pressing nubs run through the recesses and, on a main side of the base plate facing away from the pressing nub plate, project beyond the main side of the base plate; and
wherein the pressing nub plate is arranged between the pressing plate and the base plate.

2. The pressing device, according to claim 1, wherein:
the receiving device has an edge element arranged on a lateral edge region of the base plate, running around a center of the base plate at least in one portion projecting from the base plate in the direction of the pressing plate; and
wherein the edge element laterally runs around the pressing nub plate.

3. The pressing device, according to claim 2, wherein:
a gap is formed between the pressing plate and the edge element and an edge region element of the pressing nub element projecting from the pressing nub plate is arranged in the gap;
wherein the edge region element presses against the pressing plate in a direction perpendicular to the normal direction (N) of the pressing plate.

4. The pressing device, according to claim 3, wherein:
the receiving device has a hook element which limits a movement of the pressing plate in the normal direction (N) of the pressing plate, in the direction away from the base plate, by way of an interlocking fit with the pressing plate.

5. The pressing device, according to claim 4, wherein:
the receiving device has a pressing element;
wherein in the edge region of the pressing nub plate the pressing nub element has a tab projecting from the pressing nub plate (3a) in the direction away from the base plate; and
wherein at least a part of the tab is arranged between the pressing element and the pressing plate.

6. The pressing device, according to claim 5, wherein:
a portion of the tab has a mechanical contact with a main side of the pressing plate facing away from the base plate.

7. The pressing device, according to claim 1, wherein:
the pressing plate has a pressing plate opening therethrough, the pressing nub plate has a pressing nub plate opening therethrough, and the base plate has a base plate opening therethrough; and
wherein the pressing plate opening, the pressing nub plate opening, and the base plate opening (4ac) are arranged in alignment with each other in the normal direction (N) of the pressing plate.

8. The pressing device, according to claim 7, wherein:
the receiving device has a base plate opening element, which runs around the base plate opening, projects from the base plate in the direction of the pressing plate opening, and in particular is annular; and
wherein a part of the base plate opening element is arranged in the pressing plate opening.

9. The pressing device, according to claim 8, wherein:
an inner wall surface of the base plate opening element delimiting the base plate opening is formed so that the base plate opening decreases in size in the direction of the pressing plate.

10. The pressing device, according to claim 7, wherein:
the pressing nub element has a pressing nub plate opening element, which runs around the pressing nub plate opening, projects from the pressing nub plate, and is annular; and
wherein a part of the pressing nub plate opening element is arranged in the pressing plate opening and in the base plate opening.

11. The pressing device, according to claim 10, wherein:
an inner wall surface of the pressing nub plate opening element delimiting the pressing nub plate opening is formed so that the pressing nub plate opening decreases in size in the direction of the pressing plate.

12. A power-semiconductor module, comprising:
a pressing device according to claim 1; and
a substrate on which power-semiconductor components are arranged and are electrically conductively contacted with the substrate;
wherein at least a plurality of the pressing nubs are arranged in alignment with the power-semiconductor components above the power-semiconductor components, so that the power-semiconductor components are arranged between the relevant pressing nubs and the substrate;
wherein the relevant pressing nubs are designed to exert a pressure, acting in the direction of the substrate, directly or indirectly on the power-semiconductor components.

13. The power-semiconductor module, according to claim 12, wherein:

the power-semiconductor module has a frame element with a sleeve running in the direction of the pressing device; and wherein a part of the sleeve is arranged in the base plate opening.

14. The power-semiconductor module, according to claim 13, wherein:

a part of the sleeve is arranged in the pressing nub plate opening.

15. The power-semiconductor module, according to claim 14, wherein:

the diameter of a portion of an outer wall of the sleeve that is in mechanical contact with the pressing device decreases in size in the direction away from the substrate.

16. The power-semiconductor module, according to claim 15, wherein:

the power-semiconductor module has a pressure-generating device; and wherein the pressure-generating device is designed to press the pressing device in the direction of the substrate.

17. The power-semiconductor module, according to claim 16, wherein:

the pressing device further provides that the pressing plate has a pressing plate opening therethrough, the pressing nub plate has a pressing nub plate opening therethrough, and the base plate has a base plate opening therethrough;

wherein the pressing plate opening, the pressing nub plate opening, and the base plate opening are arranged in alignment with each other in the normal direction (N) of the pressing plate; and wherein a pressure-generating device has a screw passing through the pressing plate opening, through the pressing nub plate opening, through the base plate opening, and through an opening of the substrate, and has a spring element, wherein the screw is designed to press the pressing device in the direction of the substrate via the spring element.

18. A power-electronic arrangement, comprising:

a power-semiconductor module according to claim 12, and further comprising:

a base plate on which the substrate is arranged; and wherein the base plate is part of a heat sink or is provided for arrangement on a heat sink.

* * * * *